US010211643B2

(12) United States Patent
Soldatov et al.

(10) Patent No.: US 10,211,643 B2
(45) Date of Patent: Feb. 19, 2019

(54) SWITCHING MODULE

(71) Applicants: Alexander Petrovich Soldatov, Zelenograd (RU); Vasily Alekseyevich Syngaevskiy, Moscow (RU); Gennady Mihaylovich Vydolob, Moscow (RU)

(72) Inventors: Alexander Petrovich Soldatov, Zelenograd (RU); Vasily Alekseyevich Syngaevskiy, Moscow (RU); Gennady Mihaylovich Vydolob, Moscow (RU)

(73) Assignee: NXP USA, Inc., Austin, TX (US)

( * ) Notice: Subject to any disclaimer, the term of this patent is extended or adjusted under 35 U.S.C. 154(b) by 275 days.

(21) Appl. No.: 15/029,294

(22) PCT Filed: Oct. 24, 2013

(86) PCT No.: PCT/RU2013/000944
§ 371 (c)(1),
(2) Date: Apr. 14, 2016

(87) PCT Pub. No.: WO2015/060744
PCT Pub. Date: Apr. 30, 2015

(65) Prior Publication Data
US 2016/0254675 A1 Sep. 1, 2016

(51) Int. Cl.
*H02J 4/00* (2006.01)
*G01R 19/00* (2006.01)
*H02M 1/00* (2006.01)

(52) U.S. Cl.
CPC ............ *H02J 4/00* (2013.01); *G01R 19/0092* (2013.01); *H02M 1/00* (2013.01); *H02M 2001/0009* (2013.01)

(58) Field of Classification Search
CPC . H02J 4/00; G01R 19/00; H02M 1/00; H02M 2001/00

(Continued)

(56) References Cited

U.S. PATENT DOCUMENTS 6,304,108 B1   10/2001  Inn
6,737,856 B2    5/2004  Sander
(Continued)

FOREIGN PATENT DOCUMENTS

DE     102004041886        3/2006
JP       2005260629 A  *  9/2005
WO      2011145970 A1    11/2011

OTHER PUBLICATIONS

International Search Report for application No. PCT/RU2013/000944, dated Jun. 27, 2014, 9 pages.

*Primary Examiner* — Rexford Barnie
*Assistant Examiner* — Joseph Inge

(57) ABSTRACT

A switching module comprising at least one current sense component. The at least one current sense component is arranged to generate a first phase sense current based at least partly on a received output signal of the at least one differential amplifier when the first cross-coupling component is configured to operably couple the differential inputs of the at least one differential amplifier to the output node of the at least one power switching device and the current sense feedback node with a first polarity, generate a second phase sense current based at least partly on a received output signal of the at least one differential amplifier when the first cross-coupling component is configured to operably couple the differential inputs of the at least one differential amplifier to the output node of the at least one power switching device and the current sense feedback node with a second polarity, and output a combined sense current based at least partly on a combination of the first phase sense current and the second phase sense current.

20 Claims, 5 Drawing Sheets

(58) Field of Classification Search
USPC .......................................................... 307/113
See application file for complete search history.

(56) References Cited

U.S. PATENT DOCUMENTS

| | | |
|---|---|---|
| 7,102,337 B2 | 9/2006 | Wheeler et al. |
| 7,151,361 B2 | 12/2006 | Xi |
| 7,180,278 B2 | 2/2007 | Tai et al. |
| 7,245,116 B2 | 7/2007 | Tateno et al. |
| 7,279,954 B2 | 10/2007 | Throngnumchai et al. |
| 8,325,451 B2 | 12/2012 | Mitsuda |
| 2002/0024376 A1 | 2/2002 | Sander |
| 2007/0262761 A1* | 11/2007 | Ishigaki ................ H02M 3/156 323/282 |
| 2010/0244947 A1 | 9/2010 | Massie et al. |
| 2013/0057241 A1* | 3/2013 | Shuvalov ............. H03K 17/122 323/271 |

* cited by examiner

SWITCHING MODULE

FIELD OF THE INVENTION

This invention relates to a switching module, and in particular to a switching module comprising at least one power switching device arranged to output from an output node thereof a load current for the switching module, and at least one current sense component arranged to generate at least one current sense signal for outputting by the switching module representative of the load current.

BACKGROUND OF THE INVENTION

Electronic power switches have various applications, including the control of light sources such as vehicle headlamps and the like. The current market trend is to use high efficiency light sources such as light emitting diodes (LEDs), which require a very accurate current sense within the power switch/supply. However, in middle to low cost vehicles conventional bulbs are still used within the headlamps, which require a low ON-resistance power switch. Consequently, market demands require power switches that are capable of supporting both types of light sources, and thus that are able to combine a low ON-resistance power switch for heavy loads like conventional bulbs and also have very accurate current sense for light load such as LEDs.

"Smart" power switching circuits, such as for example Freescale's "eXtreme switch" devices, may be used for driving different types of loads such as bulb-lamps or DC-motors. Smart power switching circuits can be configured to perform additional functions such as, for example, protecting the devices against short-circuits, protecting power-MOS elements against over-temperature, providing special and adjustable over-current protection profile required for different bulbs, sensing the current flow at any given time and providing the sense current through a current sense terminal (CSNS), load diagnostics such as open-load detection, load control which may be adapted to requirements by means of pulse width modulation (PWM), suppressing electromagnetic interference during the process of switching, etc.

FIG. 1 illustrates a simplified circuit diagram of an example of a smart power switching module 100. The smart power switching module 100 comprises a power switching device 110 operably coupled between a battery supply 102 and an output 104 of the power switching module 100. The power switching device 110 is controllable via a gate signal 114 to allow a load current (I_LOAD) 112 to flow therethrough, from the battery supply 102 to the output 104 of the power switching module 100.

The power switching module 100 further comprises current sense component for the load current (I_LOAD) 112. The current sense component comprises a differential or error amplifier 130 comprising a first (inverting) input operably coupled to a source node 115 of the power switching device 110. In this manner, the first (inverse) input of the differential amplifier 130 is arranged to receive a voltage signal representative of the voltage level of the battery supply 102 less the potential difference across the power switching device 110.

The differential amplifier 130 further comprises a second (non-inverting) input arranged to receive a current sense feedback signal generated by a current sense feedback component of the current sense component. The current sense feedback component comprises a sense switching device 120 operably coupled between the battery supply 102 and a ground plane 106. The sense switching device 120 is controllable by the same gate signal 114 as the power switching device 110. In this manner, the current flow through the sense switching device 120 is representative of the current flow through the power switching device 110. A source node 125 of the sense switching device 120 is operably coupled to the second (non-inverting) input of the differential amplifier 130. In this manner, the second (non-inverting) input of the differential amplifier 130 is arranged to receive a voltage signal representative of the voltage level of the battery supply 102 less the potential difference across the sense switching device 120.

A feedback transistor 140 is operably coupled between the source node 125 of the sense switching device 120 and the ground plane 106. A gate of the feedback transistor 140 is operably coupled to a (positive) output of the differential amplifier 130. In this manner, the sense switching device 120 and the feedback transistor 140 are operably coupled in series, with the sense switching device 120 being controllable via the gate signal 114 and the feedback transistor 140 being controllable via the output of the differential amplifier 130. The differential amplifier 130 is arranged to control the current I_SENSE 122 through the feedback transistor 140 such that substantially equal voltage potentials are maintained at its inputs, and thus at the source nodes 115, 125 of the power switching device 110 and sense switching device 120.

Significantly, by maintaining substantially equal voltage potentials at the source nodes 115, 125 of the power switching device 110 and sense switching device 120, and because the sense switching device 120 is controlled by the same gate signal 114 as the power switching device 110, the current I_SENSE 122 is proportional to the load current (I_LOAD) 112. The feedback transistor 140 effectively acts as a voltage to current converter, converting the voltage signal output by the differential amplifier 130 into the current I_SENSE 122. As such, the voltage signal output by the differential amplifier 130 may be considered as being representative of the load current (I_LOAD) 112.

The output of the error amplifier 130 is further used to control an input stage of a current mirror arrangement, whereby the output of the error amplifier 130 is provided to a gate of a voltage-to-current converter transistor 150, which converts the output signal of the error amplifier 130 into an intermediate current I_INT 152 representative of the current I_SENSE 122. A current-to-voltage converter transistor 160, operably coupled in series with the voltage-to-current converter transistor 150, converts the intermediate current I_INT 152 to a voltage signal 162 at its gate terminal. A further voltage-to-current converter transistor 170, which has its gate terminal operably coupled to the gate terminal of the current-to-voltage converter transistor 160, converts the voltage signal 162 into an output sense current I_CSNS 172 which is output through a current sense terminal (CSNS) 180.

The output sense current I_CSNS 172 in the illustrated power switching circuit 100 may be calculated as:

$$I\_CSNS = (M/N) * ((I\_LOAD/RATIO) + (Vos/(RDSON*RATIO))) \quad \text{[Equation 1]}$$

where:
"RATIO" refers to the electrical ratio between the power and sense transistor devices 110, 120 ("RATIO" is defined as current through the main power switching transistor 110 divided by current through the sense switching device 120 when voltages on their source nodes 115, 125 are equal);

Vos refers to the voltage offset of the error amplifier 130;

RDSON refers to the Drain-to-Source ON resistance of the main power switching device 110; and the ratio (M/N) refers to current gain for the current mirror circuit (output sense current I_CSNS 172 through the voltage-to-current converter transistor 170 divided by the current I_SENSE 122 through the transistor 140) formed by the two common gate transistor structures of transistors 140 and 150 (N:1) and transistors 160 and 170 (1:M).

If transistors 140, 150, 160, 170 are such that M=N (e.g. where transistors 140, 150, 160, 170 are all of equal size) the ratio M/N=1 and the term (M/N) may be omitted from Equation 1.

The relationship between the load current I_LOAD 112 and the output sense current I_CSNS 172 is often represented by a current sense ratio (CSR) parameter, where (assuming M/N=1):

$$CSR = I\_CSNS/I\_LOAD = (1/RATIO)*(1+Vos/(I\_LOAD*RDSON)) \quad [\text{Equation 2}]$$

From Equation 2, it can be seen that, since RDSON is substantially constant, the primary contributing factors to CSR inaccuracy for a given I_LOAD are the electrical ratio between main and sense power die devices 110, 120 (RATIO) and the offset of the error amplifier 130 (Vos).

FIG. 2 illustrates a simplified example of the influence of the RATIO and the Vos on the inaccuracy of the CSR. An example of a typical ideal CSR is illustrated at 200. An example of typical CSR inaccuracy caused by variations in the electrical ratio between main and sense power die devices 110, 120 (RATIO), for example due to part-to-part variations, temperature, load current, etc., is illustrated at 210. An example of typical CSR inaccuracy caused by a combination of the electrical ratio between main and sense power die devices 110, 120 (RATIO) and the offset of the error amplifier 130 (Vos) is illustrated at 220. At high load currents, such as illustrated at 230, the primary contributor to CSR inaccuracy is the electrical ratio between main and sense power die devices 110, 120 (RATIO). However, at low load currents the offset of the error amplifier 130 (Vos) becomes the more significant contributor to CSR inaccuracy, which has a significant impact on the accuracy of the current sense component for light loads such as LEDs.

SUMMARY OF THE INVENTION

The present invention provides a switching module and a method of generating a current sense signal for outputting by a switching module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
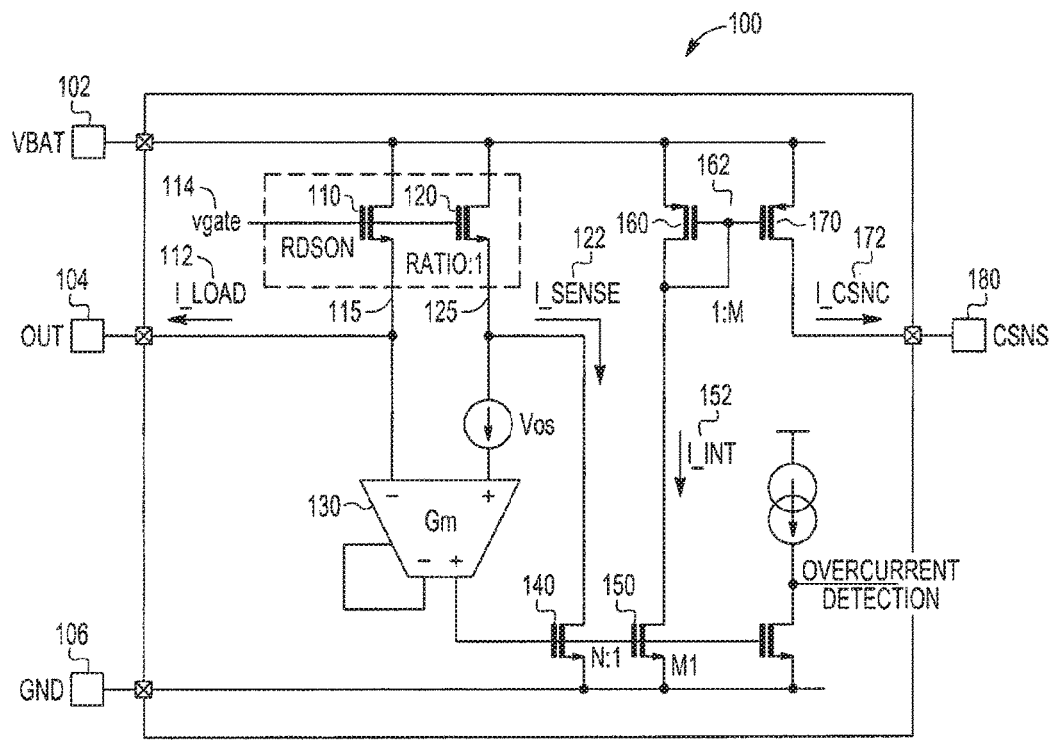
FIG. 1 illustrates a simplified circuit diagram of an example of a known smart power switching module.
Figure 2:
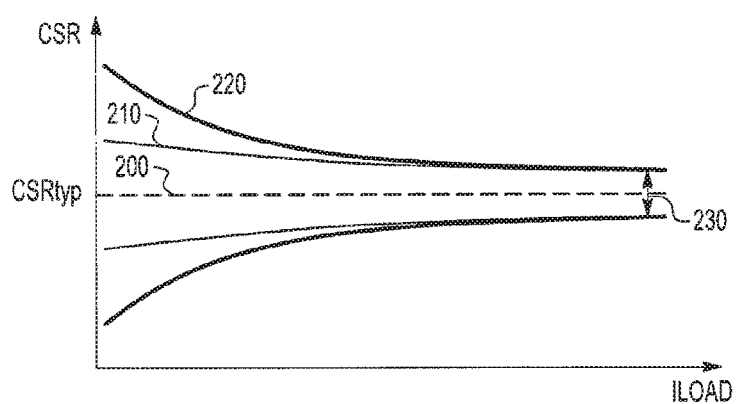
FIG. 2 illustrates a simplified example of the influence of the electrical ratio between the power and sense transistor devices and the voltage offset of the error amplifier on the inaccuracy of the current sense ratio (CSR).

The present invention will now be described with reference to the accompanying drawings in which there is illustrated example of a 'smart' power switching module comprising a current sense component arranged to generate a current sense signal for outputting by the switching module. However, it will be appreciated that the present invention is not limited to the specific examples herein described with reference to the accompanying drawings, as will be apparent to a skilled person. Furthermore, because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

In accordance with examples of a first aspect of the invention there is provided a switching module comprising at least one power switching device arranged to output from an output node thereof a load current for the switching module. The switching module further comprises at least one current sense component arranged to generate at least one current sense signal for outputting by the switching module representative of the load current. The at least one current sense component comprises at least one differential amplifier comprising differential inputs arranged to be operably coupled to the output node of the at least one power switching device and a current sense feedback node, and an output arranged to output a signal representative of the load current output by the at least one power switching device, and a sense current generation component arranged to receive a signal output by the at least one differential amplifier and generate a sense current based at least partly thereon.

The at least one current sense component further comprises a first cross-coupling component controllable to alternate a polarity with which the differential inputs of the at least one differential amplifier are operably coupled to the output node of the at least one power switching device and the current sense feedback node. The at least one sense current generation component is arranged to generate a first phase sense current based at least partly on a received output signal of the at least one differential amplifier when the first cross-coupling component is configured to operably couple the differential inputs of the at least one differential amplifier to the output node of the at least one power switching device and the current sense feedback node with a first polarity, generate a second phase sense current based at least partly on a received output signal of the at least one differential amplifier when the first cross-coupling component is configured to operably couple the differential inputs of the at least one differential amplifier to the output node of the at least one power switching device and the current sense feedback node with a second polarity, and output a combined sense current based at least partly on a combination of the first phase sense current and the second phase sense current.

In this manner, by alternating the polarity with which the differential inputs of the differential amplifier are operably coupled to the output node of the power switching device and the current sense feedback node, the relative effect of the voltage offset (Vos) of the differential amplifier is alternated between a positive and negative effect on the magnitude of the differential signals output by the differential amplifier. Accordingly, the effect of the voltage offset (Vos) on the current sense signal output by the switching module of the differential amplifier may be substantially cancelled out by combining the first phase sense current and the second phase sense current.

In accordance with one optional example, the at least one current sense component may be arranged to alternate between a first operating phase and a second operating phase such that:

during the first operating phase the first cross-coupling component is configured to operably couple the output node of the at least one power switching device to an inverting input of the differential amplifier and the current sense feedback node to a non-inverting input of the differential amplifier; and during the second operating phase the first cross-coupling component is configured to operably couple the output node of the at least one power switching device to the non-inverting input of the differential amplifier and the current sense feedback node to the inverting input of the differential amplifier.

In accordance with one optional example, the sense current generation component may be arranged to generate the first phase sense current based at least partly on the received output signal of the at least one differential amplifier during the first operating phase of the at least one current sense component and the second phase sense current based at least partly on the received output signal of the at least one differential amplifier during the second operating phase of the at least one current sense component.

In accordance with one optional example, the at least one differential amplifier may comprise a differential output and the at least one current sense component may further comprise a second cross-coupling component arranged to operably couple the differential output of the at least one differential amplifier to the sense current generation component such that:

during the first operating phase of the at least one current sense component the second cross-coupling component is configured to operably couple a non-inverted output of the at least one differential amplifier to the sense current generation component; and during the second operating phase of the at least one current sense component the second cross-coupling component is configured to operably couple an inverted output of the at least one differential amplifier to the sense current generation component.

In accordance with one optional example, the sense current generation component may comprise:

a first voltage-to-current converter device arranged to convert a voltage signal received at an input thereof to the first phase sense current;

a second voltage-to-current converter device arranged to convert a voltage signal received at an input thereof to the second phase sense current; and a switching circuit arranged to selectively couple a received output signal of the at least one differential amplifier to the input of the first voltage-to-current converter device during the first operating phase of the at least one current sense component and to the input of the second voltage-to-current converter device during the second operating phase of the at least one current sense component.

In accordance with one optional example, a charge storage component may be operably coupled to the input of each of the first and second voltage-to-current converter devices.

In accordance with one optional example, the at least one current sense component may further comprise a current mirror circuit comprising:

at least one current-to-voltage converter device arranged to convert the combined sense current output by the at least one sense current generation component into a sense current voltage; and at least one voltage-to-current converter device arranged to convert the sense current voltage from the at least one current-to-voltage converter device into the current sense signal output by the switching module.

In accordance with one optional example, the at least one current sense component may further comprise at least one control component arranged to alternate an operating mode of the at least one current sense component between a first operating phase and a second operating phase.

In accordance with one optional example, the at least one control component may be arranged to control at least one of:

the first cross-coupling component;
the second cross-coupling component; and
the switching circuit of the sense current generation component.

In accordance with one optional example, the at least one current sense component may comprise at least one current sense feedback component arranged to generate a current sense feedback signal at the current sense feedback node based at least partly on the differential output signal of the at least one differential amplifier.

In accordance with one optional example, the current sense feedback component may be arranged to receive the output signal of the at least one differential amplifier received by the sense current generation component, and the at least one differential amplifier is arranged to control the current sense feedback component such that equal voltage potentials are maintained at the inputs thereof.

In accordance with one optional example, the switching module may be implemented within an integrated circuit device comprising at least one die within a single integrated circuit package.

In accordance with examples of a second aspect of the invention there is provided a method of generating a current sense signal for outputting by a switching module. The method comprises generating a first phase sense current based at least partly on an output signal received from a differential amplifier when differential inputs of the differential amplifier are operably coupled with a first polarity to an output node of a power switching device of the switching module and a current sense feedback node, the output signal of the differential amplifier being representative of the load current output by the at least one power switching device, generating a second phase sense current based at least partly on an output signal received from the differential amplifier when the differential inputs of the differential amplifier are operably coupled with a second polarity to the output node of the power switching device of the switching module and the current sense feedback node, and outputting a combined sense current based at least partly on a combination of the first phase sense current and the second phase sense current.

Figure 3:
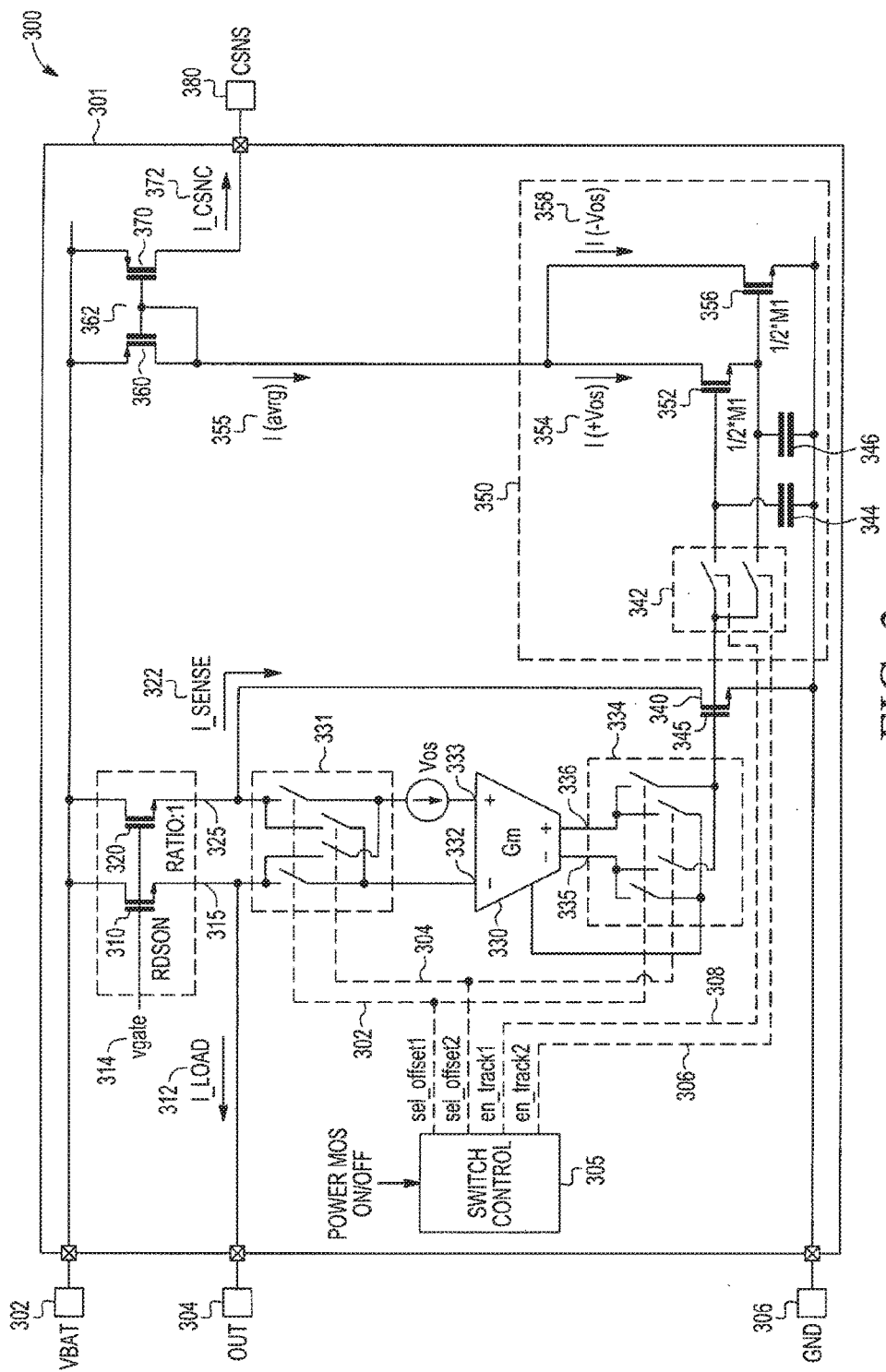
FIGS. 3 to 5 illustrate simplified circuit diagrams of an example of a power switching module.

Referring first to FIG. 3, there is illustrated a simplified circuit diagram of an example of a power switching module 300, such as a smart power switch. The smart power switching module 300 may be implemented within an integrated circuit device 301 comprising at least one die within a single integrated circuit package, and comprises a power switching device 310 operably coupled between a battery supply 302 and an output 304 of the power switching module 300. The power switching device 310 is controllable via a gate signal 314 to allow a load current (I_LOAD) 312 to flow there through, from the battery supply 302 to the output 304 of the power switching module 300.

The power switching module 300 further comprises a current sense component for the load current (I_LOAD) 312. The current sense component comprises a differential or error amplifier 330 comprising differential inputs 332, 333 arranged to be operably coupled to an output node 315 of the power switching device 310 (which in the illustrated example comprises a source node of the power switching device 310) and a current sense feedback node 325. In this manner, the differential inputs 332, 333 of the differential amplifier 330 are arranged to receive a voltage signal representative of the voltage level of the battery supply 302 less the potential difference across the power switching device 310.

The differential inputs 332, 333 of the differential amplifier 330 are further arranged to receive a current sense feedback signal generated at a current sense feedback node by a current sense feedback component of the current sense component. In the illustrated example, the current sense feedback component comprises a sense switching device 320 operably coupled between the battery supply 302 and a ground plane 306. The sense switching device 320 is controllable by the same gate signal 314 as the power switching device 310. In this manner, the current flow through the sense switching device 320 is representative of the current flow through the power switching device 310. A source node 325 of the sense switching device 320 provides the current sense feedback node and is arranged to be operably coupled to the differential inputs 332, 333 of the differential amplifier 330. In this manner, the differential inputs 332, 333 of the differential amplifier 330 are further arranged to receive a voltage signal representative of the voltage level of the battery supply 302 less the potential difference across the sense switching device 320.

A feedback transistor 340 is operably coupled between the source node 325 of the sense switching device 320 and the ground plane 306. A gate 345 of the feedback transistor 340 is arranged to be operably coupled to a differential output 335, 336 of the differential amplifier 330. In this manner, the sense switching device 320 and the feedback transistor 340 are operably coupled in series, with the sense switching device 320 being controllable via the gate signal 314 and the feedback transistor 340 being controllable via the differential output(s) 335, 336 of the differential amplifier 330. The differential amplifier 330 is arranged to control the current I_SENSE 322 through the feedback transistor 340 such that substantially equal voltage potentials are maintained at its inputs 332, 333, and thus at the source nodes 315, 325 of the power switching device 310 and sense switching device 320.

Significantly, by maintaining substantially equal voltage potentials at the source nodes 315, 325 of the power switching device 310 and sense switching device 320, and because the sense switching device 320 is controlled by the same gate signal 314 as the power switching device 310, the current I_SENSE 322 is proportional to the load current (I_LOAD) 312. The feedback transistor 340 effectively acts as a voltage to current converter, converting a voltage signal output by the differential amplifier 330 into the current I_SENSE 322. As such, the voltage signal output by the differential amplifier 330 may be considered as being representative of the load current (I_LOAD) 312.

The current sense component further comprises a first cross-coupling component 331 arranged to operably couple the differential inputs 332, 333 of the differential amplifier 330 to the output node 315 of the power switching device and the current sense feedback node 325. The first cross-coupling component 331 is controllable to alternate a polarity with which the differential inputs 332, 333 of the differential amplifier 330 are operably coupled to the output node 315 of the power switching device 310 and the current sense feedback node 325.

For example, the first cross-coupling component 331 may be controllable to be configured to operably couple the output node 315 of the power switching device 310 to an inverting input 332 of the differential amplifier 330 and the current sense feedback node 325 to a non-inverting input 333 of the differential amplifier 330 during a first operating phase of the current sense component. Conversely, the first cross-coupling component 331 may be controllable to be configured to operably couple the output node 315 of the power switching device 310 to the non-inverting input 333 of the differential amplifier 330 and the current sense feedback node 325 to the inverting input 332 of the differential amplifier 330 during a second operating phase of the current sense component.

In this manner, by alternating the polarity with which the differential inputs 332, 333 of the differential amplifier 330 are operably coupled to the output node 315 of the power switching device 310 and the current sense feedback node 325, the relative effect of the voltage offset (Vos) of the differential amplifier 330 is alternated between a positive and negative effect on the magnitude of the differential signals output by the differential amplifier 330. Accordingly, the output signals for the alternating polarity input signals may be used to cancel out the effect of the voltage offset (Vos) of the differential amplifier 330, for example as described in greater detail below.

In the example illustrated in FIG. 3, the current sense component comprises a second cross-coupling component 334 arranged to operably couple the differential outputs 335, 336 of the differential amplifier 330 to, in the illustrated example, the gate 345 of the feedback transistor 340, as well as to an input of a sense current generation component 350. The second cross-coupling component 334 is controllable to alternate a polarity of the differential output 335, 336 of the differential amplifier 330 that is operably coupled to, in the illustrated example, the gate 345 of the feedback transistor 340 and a sense current generation component 350.

For example, the second cross-coupling component 334 may be controllable to be configured to operably couple a non-inverted output 336 of the differential amplifier 330 to the gate 345 of the feedback transistor 340 and the sense current generation component 350 during a first operating phase of the current sense component. Conversely, the second cross-coupling component 334 may be controllable to be configured to operably couple an inverted output 335 of the differential amplifier 330 to the gate 345 of the feedback transistor 340 and the sense current generation component 350 during a first operating phase of the current sense component.

In this manner, the second cross-coupling component 334 enables the changes in the polarity with which the differential inputs 332, 333 of the differential amplifier 330 are operably coupled to the output node 315 of the power switching device 310 and the current sense feedback node 325 to be compensated for, such that the polarity of the differential amplifier output signal received by the gate 345 of the feedback transistor 340 and the sense current generation component 350 remain substantially constant.

The sense current generation component 350 is arranged to receive a signal output by the differential amplifier 330 and generate a sense current based on the received signal. In particular, the sense current generation component 350 is arranged to generate a first phase sense current 354 based on a received output signal of the differential amplifier 330 the first operating phase of the current sense component (i.e. when the first cross-coupling component 331 is configured to operably couple the differential inputs 332, 333 of the differential amplifier 330 to the output 315 of the power switching device 310 and the current sense feedback node 325 with a first polarity). The signal output by the differential amplifier 330 during the first operating phase of the current sense component is representative of the load current but with, say, a positive voltage offset (+Vos) of the differential amplifier 330. Accordingly, the first phase sense current 354 will be representative of the load current with an error corresponding at least in part to the positive voltage offset (+Vos) of the differential amplifier.

The sense current generation component 350 is further arranged to generate a second phase sense current 358 based on a received output signal of the differential amplifier 330 during the second operating phase of the current sense component (i.e. when the first cross-coupling component 331 is configured to operably couple the differential inputs 332, 333 of the differential amplifier 330 to the output 315 of the power switching device 310 and the current sense feedback node 325 with a second polarity). The signal output by the differential amplifier 330 during the second operating phase of the current sense component is representative of the load current but with, say, a negative voltage offset (−Vos) of the differential amplifier 330. Accordingly, the second phase sense current 358 will be representative of the load current with an error corresponding at least in part to the negative voltage offset (−Vos) of the differential amplifier 330.

The sense current generation component 350 is still further arranged to output a combined sense current 355 based at least partly on a combination of the first phase sense current 354 and the second phase sense current 358. In this manner, by combining the first phase sense current 354 and the second phase sense current 358, the positive and negative voltage offset errors within the first phase sense current 354 and the second phase sense current 358 substantially cancel each other out. As a result, the combined sense current 355 will be representative of the load current with substantially no differential amplifier voltage offset (Vos) error.

In the illustrated example, the sense current generation component 350 comprises a first voltage-to-current converter device 352 arranged to convert a voltage signal received at an input thereof to the first phase sense current 354, and a second voltage-to-current converter device 356 arranged to convert a voltage signal received at an input thereof to the second phase sense current 358. The sense current generation component 350 illustrated in FIG. 3 further comprises a switching circuit 342 arranged to selectively couple a received output signal of the differential amplifier component 330 to the input of the first voltage-to-current converter device 352 during the first operating phase of the current sense component and to the input of the second voltage-to-current converter device 356 during the second operating phase of the current sense component. A charge storage component 344, 346, which in the illustrated example is implemented by way of a capacitance, is operably coupled to the input of each of the first and second voltage-to-current converter devices 352, 356 respectively. In this manner, the respective inputs of the voltage-to-current converter device 352, 356 track the output signal of the differential amplifier component when operably coupled thereto by the switching circuit 342, whilst the respective charge storage components 344, 346 hold the voltage signal at the respective inputs of the voltage-to-current converter devices 352, 356 when not operably coupled to the output of the differential amplifier component 330.

In the illustrated example, the current sense component further comprises a current mirror circuit comprising a current-to-voltage converter device 360 arranged to convert the combined sense current 355 output by the sense current generation component 350 into a sense current voltage 362, and a voltage-to-current converter device 370 arranged to convert the sense current voltage 362 into a sense current I_CSNS 372 which is output through a current sense terminal (CSNS) 380 of the switching module 300.

The current sense component may further comprises a control component 305 arranged to alternate an operating mode of the current sense component between the first operating phase and the second operating phase. For example, the control component 305 may be arranged to control the first cross-coupling component 331 to alternate the polarity with which the differential inputs 332, 333 of the differential amplifier 330 are operably coupled to the output node 315 of the power switching device 310 and the current sense feedback node 325. In the illustrated example, the control component 305 may be further arranged to control the second cross-coupling component 334 to alternate the polarity of the differential output 335, 336 of the differential amplifier 330 that is operably coupled to, in the illustrated example, the gate 345 of the feedback transistor 340 and the sense current generation component 350. The control component 305 may still further be arranged to control the switching circuit 342 of the sense current generation component 350 to selectively couple a received output signal of the differential amplifier component 330 to the input of the first voltage-to-current converter device 352 during the first operating phase of the current sense component and to the input of the second voltage-to-current converter device 356 during the second operating phase of the current sense component.

Figure 4:
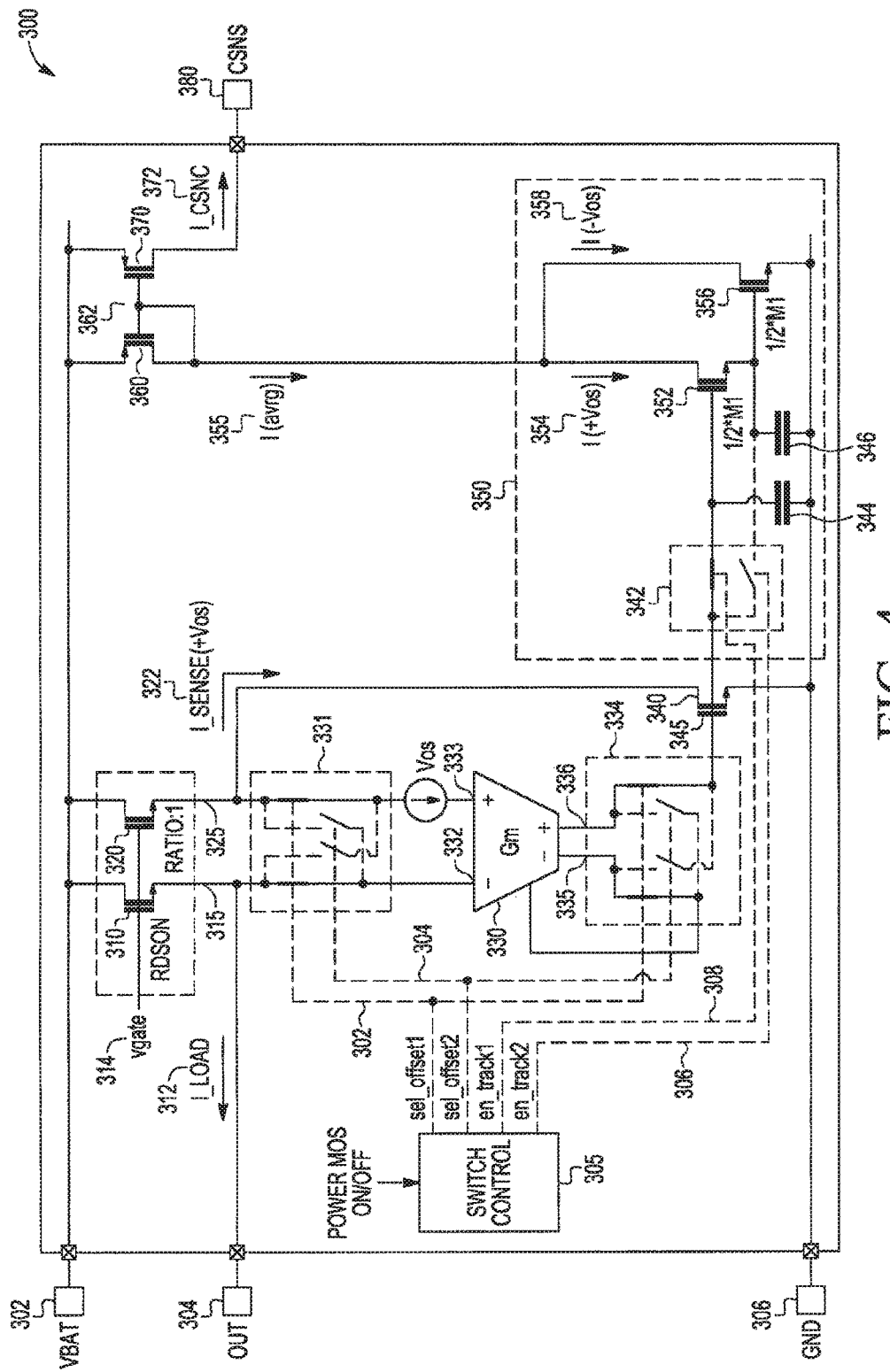

Referring now to FIG. 4, there is illustrated a simplified circuit diagram of the power switching module 300 when operating in the first operating phase of the current sense component. In this first operating phase of the current sense component, the control component 305 has configured, via control signals 302, 304, the first cross-coupling component 331 to operably couple the output node 315 of the power switching device 310 to the inverting input 332 of the differential amplifier 330, and the current sense feedback node 325 to the non-inverting input 333 of the differential amplifier 330. The control component 305 has further configured, again via control signals 302, 304, the second cross-coupling component 334, to operably couple the non-inverted output 336 of the differential amplifier 330 to the gate 345 of the feedback transistor 340 and the sense current generation component 350. The control component 305 has still further configured, via control signals 306, 308, the switching circuit 342 of the sense current generation component 350 to selectively couple the received output signal of the differential amplifier component 330 to the input of the first voltage-to-current converter device 352.

In this first operating phase of the current sense component, the feedback current I_SENSE 322 may be expressed in terms of a positive voltage offset (Vos) of the differential amplifier 330 relative to the voltage signals at nodes 315, 325. As such the feedback current I_SENSE 322 during the first operating phase of the current sense component may be expressed as:

$$I\_SENSE(+Vos)=1/RATIO*(I\_LOAD+Vos/RDSON) \quad [\text{Equation 3}]$$

where:
"RATIO" refers to the electrical ratio between the power and sense devices 310, 320 ("RATIO" is defined as current through the main power switching device 310 divided by current through the sense device 320 when voltages on their source nodes 315, 325 are equal);
Vos refers to the voltage offset of the differential amplifier 330;
RDSON refers to the Drain-to-Source ON resistance of the main power switching device 310; and
I_LOAD is the load current (I_LOAD) 312.

During this first operating phase, the input (gate) of the first voltage-to-current converter device 352 is operably coupled to the output of the differential amplifier 330 by the switching circuit 342. Accordingly, the first phase sense current 354 may be expressed as:

$$I_{(+Vos)}=(\tfrac{1}{2}*M1)/M_{fb}*1/RATIO*(I\_LOAD+Vos/RDSON) \quad [\text{Equation 4}]$$

where $(\tfrac{1}{2}*M1)/M_{fb}$ refers to the electrical ratio between the first voltage-to-current converter device 352 ($\tfrac{1}{2}*M1$) and the feedback transistor 340 ($M_{fb}$).

Figure 5:
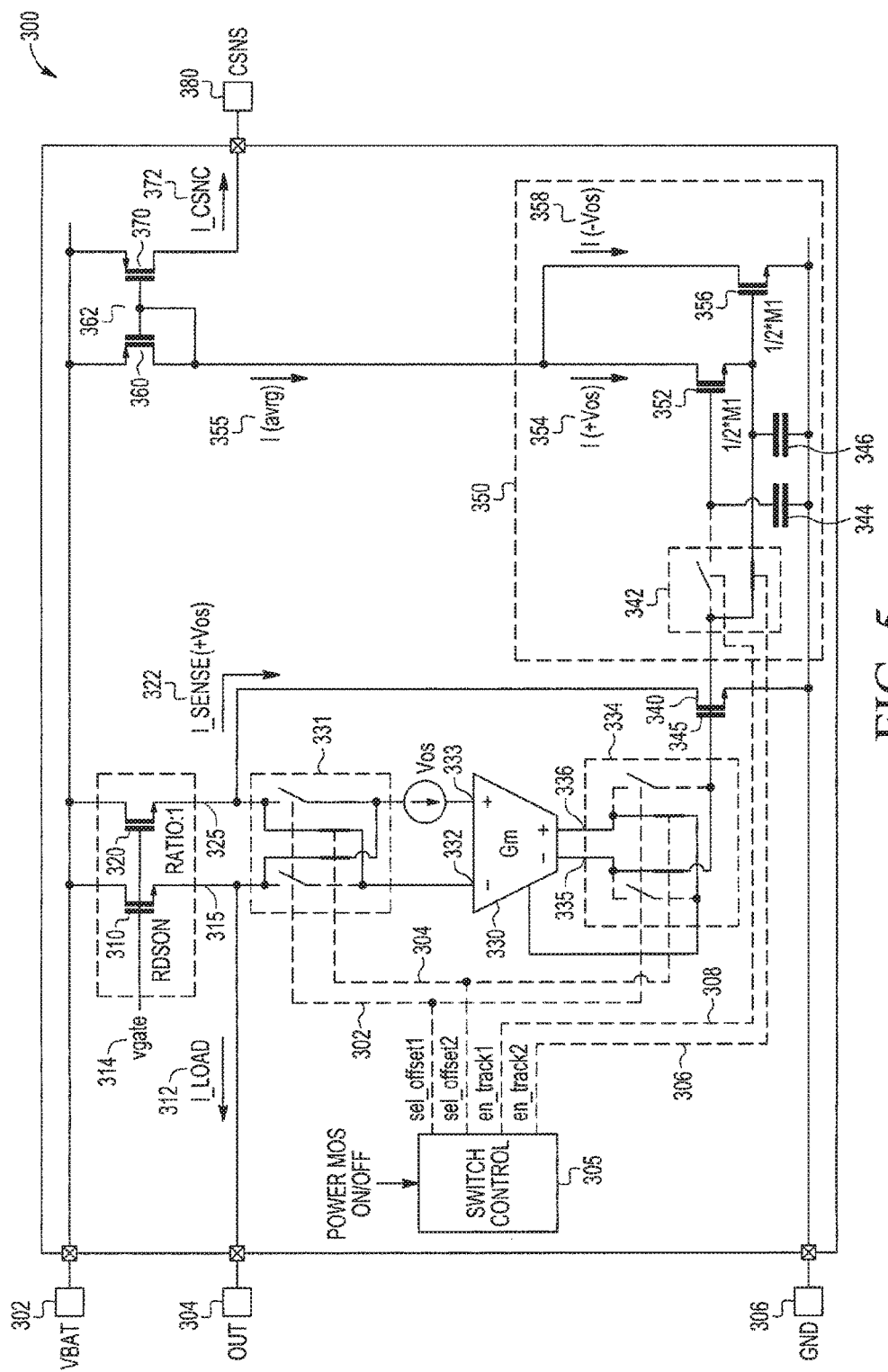

Referring now to FIG. 5, there is illustrated a simplified circuit diagram of the power switching module 300 when operating in the second operating phase of the current sense component. In this second operating phase of the current sense component, the control component 305 has configured, via control signals 302, 304, the first cross-coupling component 331 to operably couple the output node 315 of the power switching device 310 to the non-inverting input 333 of the differential amplifier 330, and the current sense feedback node 325 to the inverting input 332 of the differential amplifier 330. The control component 305 has further configured, again via control signals 302, 304, the second cross-coupling component 334, to operably couple the inverted output 335 of the differential amplifier 330 to the gate 345 of the feedback transistor 340 and the sense current generation component 350. The control component 305 has still further configured, via control signals 306, 308, the switching circuit 342 of the sense current generation component 350 to selectively couple the received output signal of the differential amplifier component 330 to the input of the second voltage-to-current converter device 356.

In this second operating phase of the current sense component, the feedback current I_SENSE 322 may be expressed in terms of a negative voltage offset (Vos) of the differential amplifier 330 relative to the voltage signals at nodes 315, 325. As such the feedback current I_SENSE 322 during the second operating phase of the current sense component may be expressed as:

$$I\_SENSE(-Vos)=1/RATIO*(I\_LOAD-Vos/RDSON) \quad [\text{Equation 5}]$$

During this second operating phase, the input (gate) of the second voltage-to-current converter device 356 is operably coupled to the output of the differential amplifier 330 by the switching circuit 342. Accordingly, the second phase sense current 358 may be expressed as:

$$I_{(-Vos)}=(\tfrac{1}{2}*M1)/M_{fb}*1/RATIO*(I\_LOAD-Vos/RDSON) \quad [\text{Equation 6}]$$

where $(\tfrac{1}{2}*M1)/M_{fb}$ refers to the electrical ratio between the second voltage-to-current converter device 356 ($\tfrac{1}{2}*M1$) and the feedback transistor 340 ($M_{fb}$).

As described above, the charge storage component 344, 346 hold the voltage signal at the respective inputs of the voltage-to-current converter devices 352, 356 when not operably coupled to the output of the differential amplifier component 330. As such, Equations 4 and 6 above are both relevant for the first and second phase sense currents 354, 358 during both of the first and second operating phases. Thus, the combined sense current 355 may be expressed as (during both the first and second operating phases):

$$\begin{aligned}
Iavrg &= I_{(+Vos)} + I_{(-Vos)} & [\text{Equation 7}] \\
&= (1/2*M1)/M_{fb}*1/RATIO*(I\_LOAD+Vos/RDSON) + \\
&\quad (1/2*M1)/M_{fb}*1/RATIO*(I\_LOAD-Vos/RDSON) & [\text{Equation 8}] \\
&= M1/M_{fb}*I\_LOAD/RATIO & [\text{Equation 9}]
\end{aligned}$$

Thus, as can be seen from Equation 9, the effect of the differential amplifier voltage offset (Vos) is cancelled out from the combined sense current 355. Significantly, by performing such differential amplifier voltage offset (Vos) cancellation using internal 'on-chip' averaging within the power switching module 300, such as herein described with reference to the accompanying drawings, improved current sense ratio (CSR) accuracy may be achieved whilst substantially reducing the off-chip calibration required to achieve a required/desired current sense accuracy. Significantly, such on-chip averaging enables real time Vos effect cancellation on the current sense signal allowing to cancel Vos temperature drift and mechanically induced Vos change as well. Such real time cannot be achieved by off-chip calibration, since calibration coefficients are typically 'flashed' (i.e. written to memory) during module calibration in factory and cannot be easily changed in real time to track condition changes.

In some examples, during an initial phase, the switching circuit 342 may be configured to operably couple a received output signal of the differential amplifier component 330 to the input of both the first voltage-to-current converter device 352 and the second voltage-to-current converter device 356 to allow the charge storage components 344, 346 to be initially charged.

Figure 6:
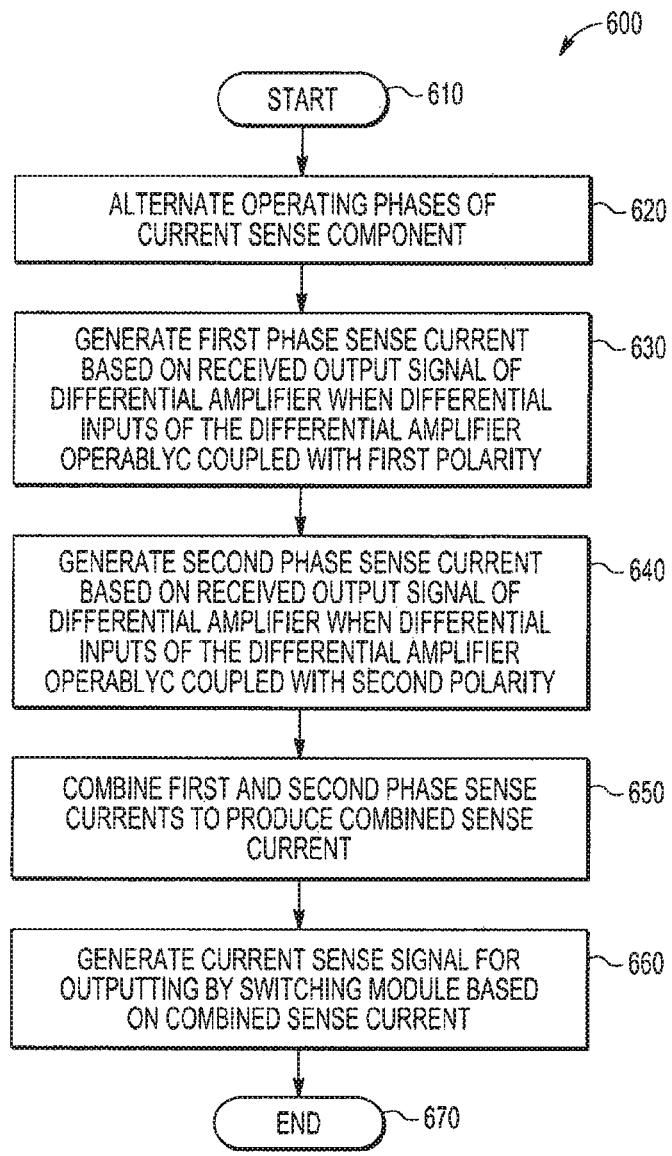
FIG. 6 illustrates a simplified flowchart of an example of a method of generating a current sense signal for outputting by a switching module.

Referring now to FIG. 6, there is illustrated a simplified flowchart 600 of an example of a method of generating a current sense signal for outputting by a switching module, such as may be implemented within the power switching module 300 of FIG. 3. The method starts at 610 and moves on to 620 where operating phases of a current sense module of the switching are alternated, whereby differential inputs of a differential amplifier are operably coupled to an output node of a power switching device of the switching module and a current sense feedback node with a first polarity in a first operating phase and a second polarity in a second operating phase.

Next, at 630, a first phase sense current is generated based at least partly on an output signal received from the differential amplifier during a first operating phase, the output signal of the differential amplifier being representative of the load current output by the power switching device. In this manner, the first phase sense current is generated when differential inputs of the differential amplifier are operably coupled with a first polarity to the output node of the power switching device of the switching module and the current sense feedback node.

A second phase sense current is generated, at 640, based at least partly on an output signal received from the differential amplifier during a second operating phase. In this manner, the second phase sense current is generated when differential inputs of the differential amplifier are operably coupled with a second polarity to the output node of the power switching device of the switching module and the current sense feedback node. In this manner, the voltage offset (Vos) of the differential amplifier has opposing effects within the first and second phase sense currents.

The first and second phase sense currents are then combined, at 650 to produce a combined sense current. In this manner, because the voltage offset (Vos) of the differential amplifier has opposing effects within the first and second phase sense currents, the voltage offset (Vos) of the differential amplifier is cancelled out within the combined sense current. A current sense current for outputting by the switching modules is then generated at 660 based on the combined sense current, and the method ends at 670.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A switching module, comprising:
   at least one power switching device arranged to output from an output node thereof a load current for the switching module, and
   at least one current sense component arranged to generate at least one current sense signal for outputting by the switching module representative of the load current; the at least one current sense component comprising:

at least one differential amplifier comprising differential inputs arranged to be operably coupled to the output node of the at least one power switching device and a current sense feedback node, and an output arranged to output a signal representative of the load current output by the at least one power switching device; and at least one sense current generation component arranged to receive a signal output by the at least one differential amplifier and generate a sense current based at least partly thereon, the sense current generation component comprising a switching circuit, a first charge storage component having a first ground terminal connected to a ground, and second charge storage component having a second ground terminal connected to the ground, the switching circuit selectively operably coupling the signal output by the at least one differential amplifier among the first charge storage component and the second charge storage component;

the at least one current sense component further comprises a first cross-coupling component controllable to alternate a polarity with which the differential inputs of the at least one differential amplifier are operably coupled to the output node of the at least one power switching device and the current sense feedback node, the first cross-coupling component comprising a first switch, a second switch, a third switch, and a fourth switch, the switching module further comprising a switch control module operably coupled to the first switch, the second switch, the third switch, and the fourth switch to control states of the first switch, the second switch, the third switch, and the fourth switch; and wherein the at least one sense current generation component is arranged to:

generate a first phase sense current based at least partly on a received output signal of the at least one differential amplifier when the first cross-coupling component is configured to operably couple the differential inputs of the at least one differential amplifier to the output node of the at least one power switching device and the current sense feedback node with a first polarity; generate a second phase sense current based at least partly on a received output signal of the at least one differential amplifier when the first cross-coupling component is configured to operably couple the differential inputs of the at least one differential amplifier to the output node of the at least one power switching device and the current sense feedback node with a second polarity; and output a combined sense current based at least partly on a combination of the first phase sense current and the second phase sense current.

2. The switching module according to claim 1, wherein the at least one current sense component is arranged to alternate between a first operating phase and a second operating phase such that:

during the first operating phase the first cross-coupling component is configured to operably couple the output node of the at least one power switching device to an inverting input of the differential amplifier and the current sense feedback node to a non-inverting input of the differential amplifier; and during the second operating phase the first cross-coupling component is configured to operably couple the output node of the at least one power switching device to the non-inverting input of the differential amplifier and the current sense feedback node to the inverting input of the differential amplifier.

3. The switching module according to claim 2, wherein the sense current generation component is arranged to generate the first phase sense current based at least partly on the received output signal of the at least one differential amplifier during the first operating phase of the at least one current sense component and the second phase sense current based at least partly on the received output signal of the at least one differential amplifier during the second operating phase of the at least one current sense component.

4. The switching module according to claim 2, wherein the at least one differential amplifier comprises a differential output and the at least one current sense component further comprises a second cross-coupling component arranged to operably couple the differential output of the at least one differential amplifier to the sense current generation component such that:

during the first operating phase of the at least one current sense component the second cross-coupling component is configured to operably couple a non-inverted output of the at least one differential amplifier to the sense current generation component; and during the second operating phase of the at least one current sense component the second cross-coupling component is configured to operably couple an inverted output of the at least one differential amplifier to the sense current generation component.

5. The switching module according to claim 1, wherein the sense current generation component comprises:

a first voltage-to-current converter device arranged to convert a voltage signal received at an input thereof to the first phase sense current;

a second voltage-to-current converter device arranged to convert a voltage signal received at an input thereof to the second phase sense current; and a switching circuit arranged to selectively couple a received output signal of the at least one differential amplifier to the input of the first voltage-to-current converter device during the first operating phase of the at least one current sense component and to the input of the second voltage-to-current converter device during the second operating phase of the at least one current sense component.

6. The switching module according to claim 5, wherein a charge storage component is operably coupled to the input of each of the first and second voltage-to-current converter devices.

7. The switching module according to claim 1, wherein the at least one current sense component further comprises a current mirror circuit comprising:

at least one current-to-voltage converter device arranged to convert the combined sense current output by the at least one sense current generation component into a sense current voltage; and at least one voltage-to-current converter device arranged to convert the sense current voltage from the at least one current-to-voltage converter device into the current sense signal output by the switching module.

8. The switching module according to claim 1, wherein the at least one current sense component further comprises at least one control component arranged to alternate an operating mode of the at least one current sense component between a first operating phase and a second operating phase.

9. The switching module of claim 8, wherein the at least one control component is arranged to control at least one of:
- the first cross-coupling component;
- the second cross-coupling component; and
- the switching circuit of the sense current generation component.

10. The switching module according to claim 1, wherein the at least one current sense component comprises at least one current sense feedback component arranged to generate a current sense feedback signal at the current sense feedback node based at least partly on the differential output signal of the at least one differential amplifier.

11. The switching module according to claim 10, wherein the current sense feedback component is arranged to receive the output signal of the at least one differential amplifier received by the sense current generation component, and the at least one differential amplifier is arranged to control the current sense feedback component such that equal voltage potentials are maintained at the inputs thereof.

12. The switching module according to claim 1 implemented within an integrated circuit device comprising at least one die within a single integrated circuit package.

13. A method of generating a current sense signal for outputting by a switching module, the method comprising:
- generating a first phase sense current based at least partly on an output signal received from a differential amplifier when differential inputs of the differential amplifier are operably coupled with a first polarity to an output node of a power switching device of the switching module and a current sense feedback node, the output signal of the differential amplifier being representative of the load current output by the at least one power switching device;
- generating a second phase sense current based at least partly on an output signal received from the differential amplifier when the differential inputs of the differential amplifier are operably coupled with a second polarity to the output node of the power switching device of the switching module and the current sense feedback node;
- switching by a switch control circuit a first cross coupling component to select between the first polarity and the second polarity, the first cross coupling component comprising a first switch, a second switch, a third switch, and a fourth switch, the switch control circuit coupled to the first switch, the second switch, the third switch, and the fourth switch, and
- outputting a combined sense current based at least partly on a combination of the first phase sense current and the second phase sense current to a sense current generation component, the sense current generation component comprising a switching circuit, a first charge storage component having a first ground terminal connected to a ground, and a second charge storage component having a second ground terminal connected to the ground, the switching circuit selectively coupling the combined sense current among the first charge storage component and the second charge storage component.

14. The method according to claim 13, further comprising alternating between a first operating phase and a second operating phase such that:
- during the first operating phase, coupling the output node of the at least one power switching device to an inverting input of the differential amplifier and the current sense feedback node to a non-inverting input of the differential amplifier; and
- during the second operating phase, coupling the output node of the at least one power switching device to the non-inverting input of the differential amplifier and the current sense feedback node to the inverting input of the differential amplifier.

15. The method according to claim 14, further comprising generating the first phase sense current based at least partly on the received output signal of the at least one differential amplifier during the first operating phase of the at least one current sense component and the second phase sense current based at least partly on the received output signal of the at least one differential amplifier during the second operating phase of the at least one current sense component.

16. The method according to claim 14, wherein the at least one differential amplifier comprises a differential output and the at least one current sense component further comprises a second cross-coupling component arranged to operably couple the differential output of the at least one differential amplifier to the sense current generation component such that:
- during the first operating phase of the at least one current sense component, coupling a non-inverted output of the at least one differential amplifier to the sense current generation component; and
- during the second operating phase of the at least one current sense component, coupling an inverted output of the at least one differential amplifier to the sense current generation component.

17. The method according to claim 13, further comprising:
- converting a voltage signal received at an input thereof to the first phase sense current using a first voltage-to-current converter device;
- converting a voltage signal received at an input thereof to the second phase sense current using a second voltage-to-current converter device; and
- coupling a received output signal of the at least one differential amplifier to the input of the first voltage-to-current converter device during the first operating phase of the at least one current sense component and to the input of the second voltage-to-current converter device during the second operating phase of the at least one current sense component.

18. The method according to claim 17, wherein a charge storage component is operably coupled to the input of each of the first and second voltage-to-current converter devices.

19. The method according to claim 13, further comprising:
- converting the combined sense current output by at least one sense current generation component into a sense current voltage; and
- converting the sense current voltage from at least one current-to-voltage converter device into the current sense signal output by the switching module.

20. The method according to claim 13, further comprising alternating an operating mode of the at least one current sense component between a first operating phase and a second operating phase.

* * * * *